(12) United States Patent
Wutte et al.

(10) Patent No.: US 8,928,066 B2
(45) Date of Patent: Jan. 6, 2015

(54) INTEGRATED CIRCUIT WITH POWER AND SENSE TRANSISTORS

(71) Applicant: Infineon Technologies Austria AG, Villach (AT)

(72) Inventors: Britta Wutte, Feistritz a.D. (AT); Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 21 days.

(21) Appl. No.: 13/757,986

(22) Filed: Feb. 4, 2013

(65) Prior Publication Data
US 2014/0217495 A1 Aug. 7, 2014

(51) Int. Cl.
*H01L 29/66* (2006.01)
*H01L 29/78* (2006.01)

(52) U.S. Cl.
CPC ...... *H01L 29/7813* (2013.01); *H01L 29/66712* (2013.01)
USPC .......................................... 257/328; 438/652

(58) Field of Classification Search
CPC ...................... H01L 29/7813; H01L 29/66712
USPC ................... 257/330, E29.257, 328; 438/652
See application file for complete search history.

(56) References Cited

U.S. PATENT DOCUMENTS

| | | | |
|---|---|---|---|
| 7,939,882 B2 * | 5/2011 | Su et al. ........................ | 257/328 |
| 7,943,990 B2 * | 5/2011 | Ma et al. ....................... | 257/330 |
| 8,129,245 B2 * | 3/2012 | Yedinak et al. ............... | 438/270 |
| 2007/0040215 A1 * | 2/2007 | Ma et al. ....................... | 257/330 |

* cited by examiner

*Primary Examiner* — Bilkis Jahan
(74) *Attorney, Agent, or Firm* — Murphy, Bilak & Homiller, PLLC

(57) ABSTRACT

An integrated circuit may include a semiconductor portion with a power transistor including first gate trenches that cross a first region and a sense transistor including second gate trenches that cross a second region. Each gate trench extends in a longitudinal direction and comprises a gate electrode and a field electrode. The first and second regions are arranged along the longitudinal direction. A first termination trench intersects at least the second gate trenches in a third region between the first and second regions. The first termination trench includes a first conductive structure that is electrically connected to the field electrodes in the second gate trenches. The characteristics of the sense transistor formed in the second region reliably and precisely replicate the characteristics of the power transistor.

24 Claims, 19 Drawing Sheets

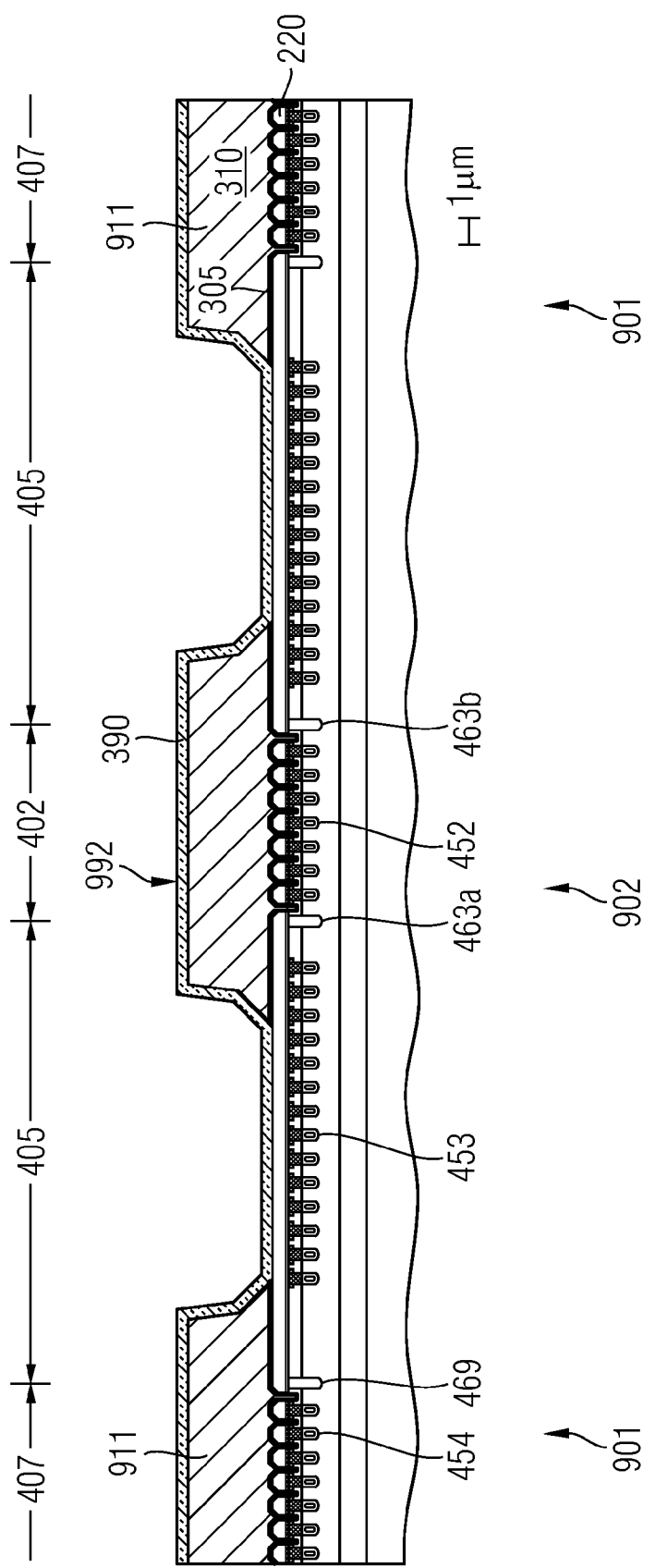

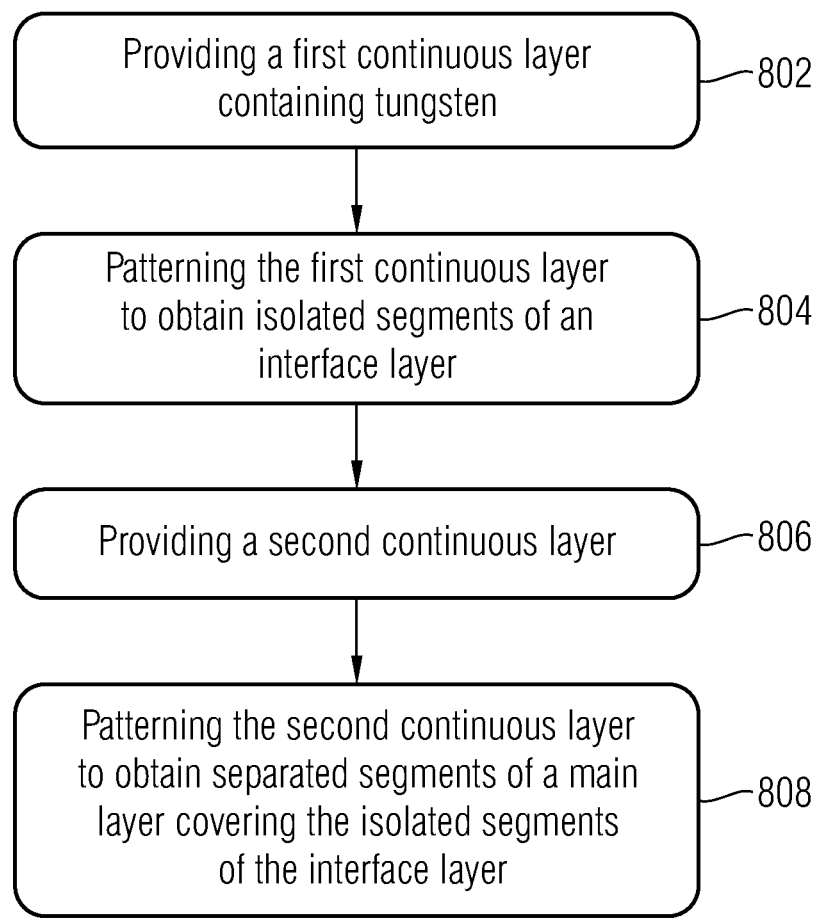

INTEGRATED CIRCUIT WITH POWER AND SENSE TRANSISTORS

BACKGROUND

In integrated circuits for power applications power transistor cells arranged in cell arrays control a load current in a load path. Sense transistor cells integrated in one of the cell arrays control a sense current through a predefined sense load in the sense path. The power and sense transistor cells are commonly controlled. On the basis of voltage differences in the sense and load paths the load current flowing through the power transistor cells is estimated. It is desirable to estimate the load current more precisely.

SUMMARY

According to an embodiment an integrated circuit includes a semiconductor portion with a power transistor including first gate trenches that cross a first region and a sense transistor including second gate trenches that cross a second region. Each gate trench extends in a longitudinal direction and comprises a gate electrode and a field electrode. The first and second regions are arranged along the longitudinal direction. A first termination trench intersects at least the second gate trenches in a third region between the first and second regions. The first termination trench includes a first conductive structure that is electrically connected to the field electrodes in the second gate trenches.

According to another embodiment a method of manufacturing an integrated circuit includes providing a first continuous layer that contains tungsten on a semiconductor portion with buried gate and field electrodes, which extend in a longitudinal direction in a first region. The first continuous layer is patterned, wherein an interface layer is obtained that includes an isolated segment covering the first region. A second continuous layer is provided that contains at least one of copper and aluminum. The second continuous layer is patterned to obtain a main layer with a separated segment covering a first portion of the isolated segment of the interface layer and leaving uncovered a second portion of the isolated segment.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated, as they become better understood by reference to the following detailed description.

FIG. 6 is a schematic cross-sectional view of a section of an integrated circuit perpendicular to the gate trenches in accordance with an embodiment providing a sense electrode with commonly patterned interface and main layers.

FIG. 8 is a schematic flow chart illustrating a method of manufacturing an integrated circuit in accordance with a further embodiment.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or heavily doped semiconductor.

Figure 1A:
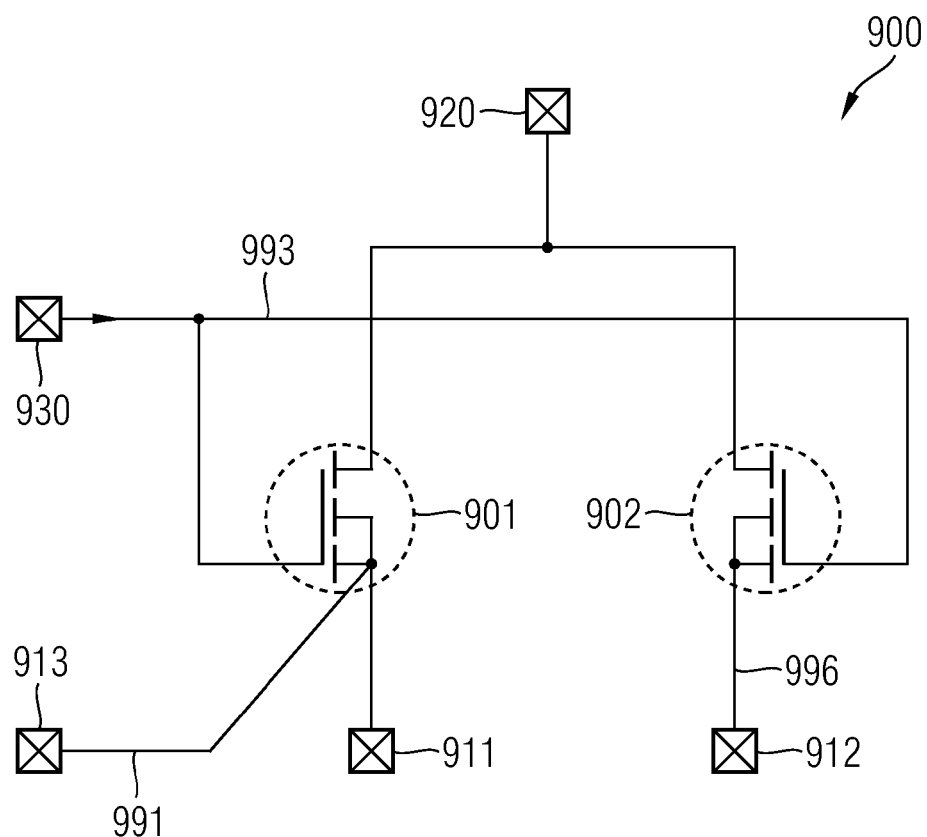
FIG. 1A is a schematic circuit diagram of an integrated circuit including a power transistor and a sense transistor according to an embodiment.
Figure 1B:
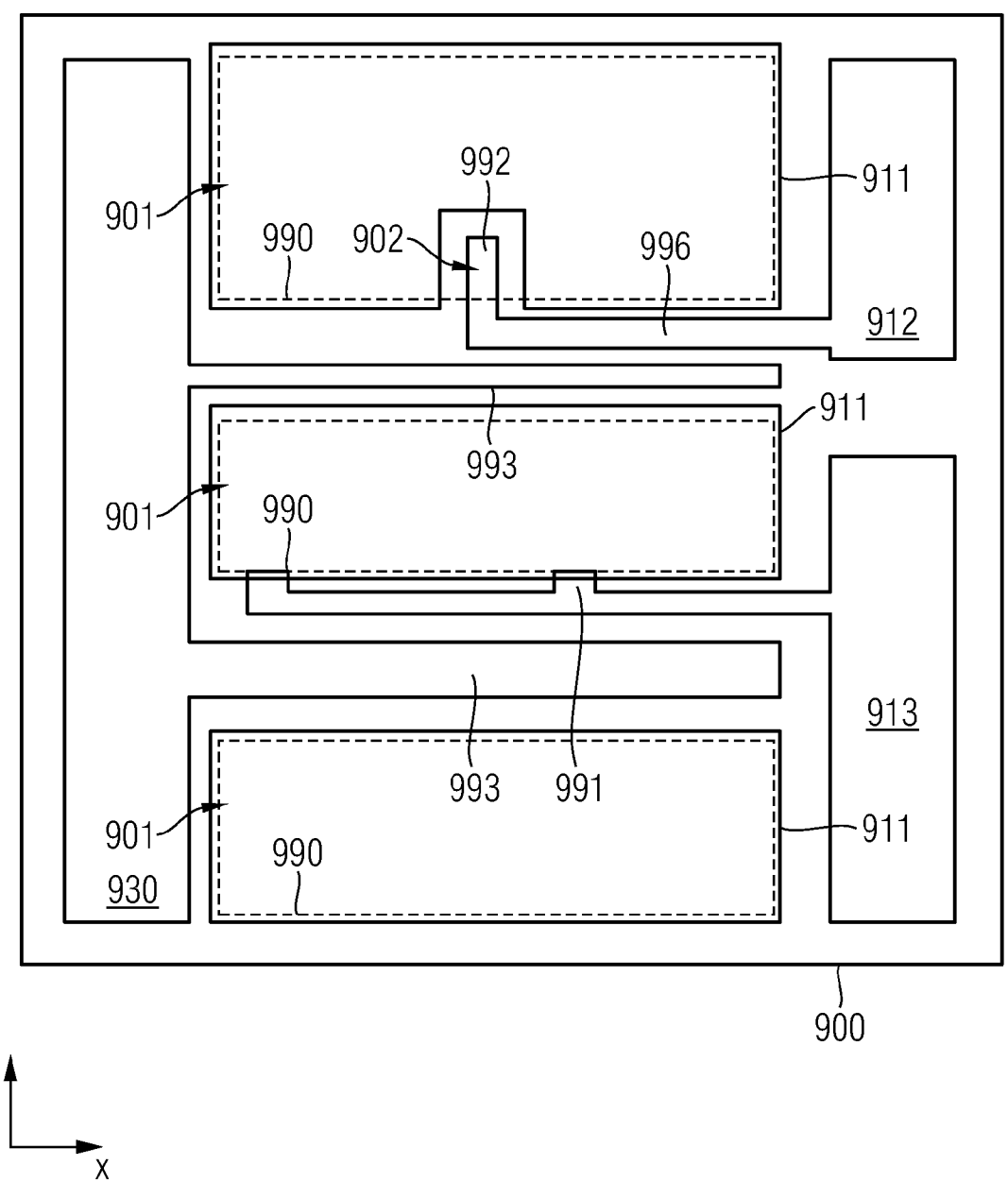
FIG. 1B is a schematic plan view of the integrated circuit of FIG. 1A.
Figure 1C:
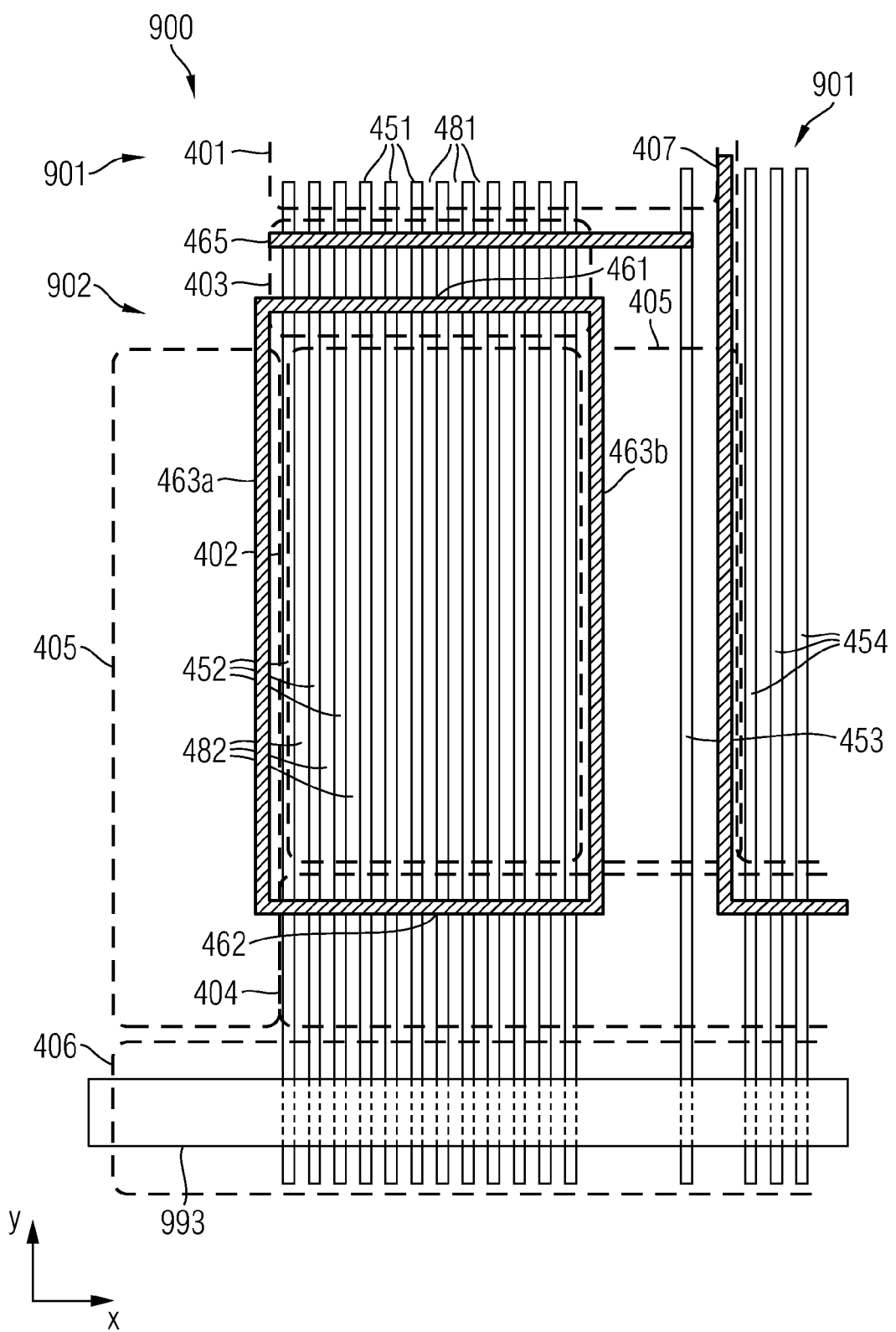
FIG. 1C shows a detail of the sensor transistor of FIG. 1B.

FIG. 1A shows a circuit diagram of an integrated circuit 900 including transistor cells according to an embodiment which is illustrated in FIGS. 1B and 1C. A power transistor 901 includes power transistor cells arranged in one or more cell arrays. One or more sense transistor cells form a sense transistor 902. The power and sense transistors 901, 902 are IGFETs (insulated gate field effect transistors), for example MOSFETs (metal oxide semiconductor field effect transistors) in the usual meaning in the art including gate electrodes with or without metal, e.g. DMOS-FETs (double-diffused MOSFETs).

Gate lines 993 connect gate electrodes of the power and sense transistors 901, 902 with each other and with a gate terminal 930. Drain zones of both the power transistor 901 and the sense transistor 902 are connected to a drain terminal 920. Source and body zones of the power transistor 901 are connected to a source terminal 911, whereas the source zones and body zones of the sense transistor 902 may be connected to a sense terminal 912 or to an internal load via a sense line 996.

A potential applied via the gate terminal 930 to the gate electrodes of the power transistor 901 controls a load current through the power transistor 901 between the drain terminal 920 and the source terminal 911. The sense transistor 902 is controlled analogously and is operated under defined load conditions. A voltage difference between a first potential at the source zones of the sense transistor 902 and a second potential at the source zones of the power transistor 901 can be used to estimate the load current supplied via the source terminal 911.

A tapping line 991 may electrically connect a tapping terminal 913 with selected source zones of the power transistor 902 such that the measurement of the source potential of the power transistor 901 does not depend from a voltage drop caused by the load current along a connection structure between the source zones of the power transistor cells and the source terminal 911. On the basis of the estimated load current, a control circuit may detect an overload or over current condition and may control the gate potential accordingly.

FIG. 1B is a schematic plan view of a bonding side of the integrated circuit 900 of FIG. 1A. The integrated circuit 900 may include one or more spatially separated cell arrays 990, which may be rectangular or L-shaped, by way of example. The gate lines 993 extend along the edges of the cell arrays 990, e.g. between neighboring cell arrays 990. The gate lines 993 structurally and electrically connect gate electrodes, which are formed in gate trenches crossing the cell arrays 990 in a longitudinal direction y, with the gate terminal 930.

Body and source zones of the power transistor cells in the cell arrays 990 may be electrically connected to source electrodes, which may be identical with or electrically connected to source terminals 911. The source terminals (source electrodes) 911 may be provided on the bonding side in substance in a vertical projection of the cell arrays 990. In addition, a tapping line 991 may connect the source zones of one or some of the power transistor cells with a tapping terminal 913.

One or more transistor cells of at least one of the cell arrays 911 provide the sense transistor cells of the sense transistor 902. A sense electrode 992 may be arranged in a vertical projection of the sense transistor cells of the sense transistor 902 on the bonding side. A sense line 996 may connect the sense electrode 992 with the sense terminal 912.

On a soldering side opposite to the bonding side a drain electrode may be electrically connected to a drain layer. The drain electrode may be identical with the drain terminal 920. In addition, the integrated circuit 900 may include further elements for temperature sensing, for example, sense resistors, a control logic for estimating the load current, or a sense load resistor. The illustrated layout provides details concerning the cell arrays, electrodes, terminals, and connection lines give only one example of a multitude of layouts integrating the sense transistor 902 according to the embodiments of the invention as illustrated in the following Figures.

FIG. 1C shows the region around the sense transistor 902 of FIG. 1B in more detail. Stripe-shaped first and second gate trenches 451, 452, including the gate and field electrodes, extend from the bonding side into a semiconductor portion of the integrated circuit 900. The first gate trenches 451 cross a first region 401 assigned to the power transistor 901 in a longitudinal direction y. Along the same direction, the second gate trenches 452 cross a second region 402 assigned to the sense transistor 902, wherein the first and second regions 401, 402 are arranged along the longitudinal direction y. For example, the first gate trenches 451 may run in the projection of the second gate trenches 452. Both the first and the second gate trenches 451, 452 may form a regular stripe pattern. The first and second gate trenches 451, 452 may have the same width and pitch. The first gate trenches 451 may be structurally connected with or separated from the second gate trenches 452.

In a third region 403 between the first and second regions 401, 402 a first termination trench 461 intersects the second gate trenches 452. According to an embodiment, the first termination trench 461 runs perpendicular to the gate trenches 451, 452. The first termination trench 461 separates second body zones 482 formed between the second gate trenches 452 in the second region 402 from body zones formed outside the first region 401, inter alia, from first body zones 481 formed between the first gate trenches 451 in the first region 401. A first conductive structure in the first termination trench 461 is structurally and electrically connected with the field electrodes in the second gate trenches 452 in the second region 402.

Since the first termination trench 461 isolates the second body zones 482 of the sense transistor 902 along the longitudinal direction y, power transistor cells can be formed in the longitudinal projection of the sense transistor cells without requiring an implant mask for the implementation of isolated body zones. In addition the first termination trench 461 contributes to a closed design of the sense transistor 902, which is more reliable as regards breakdown voltage stability and leakage mechanisms even if the sense transistor cells are closely merged with the power transistor cells.

As a consequence, the sense transistor 902 may be arranged in a central portion of one of the cell arrays 990 where during operation the highest temperatures occur. Due to the proximity of the sense transistor cells to the power transistor cells, a KILTS factor k (from k=IL/IS, k representing the factor and IL/IS the ratio between a load current IL through the power transistor and a sense current IS through the sense transistor) is virtually constant for a wide range of application parameters.

Further, with decreasing distance between the power transistor 901 and the sense transistor 902 a spread of the sense current into the surrounding regions is reduced and more precisely approximates the spread of the load current in the power transistor cells. As a consequence, the on-state resistance Ron of the sense transistor 902 more precisely approximates the on-state resistance Ron of the power transistor 901 and the load current estimation becomes more accurate. In addition, more chip area can be assigned to power transistor cells such that area efficiency is improved.

Opposite to the third region 403, the second gate trenches 452 may cross a fourth region 404 and may extend into a sixth region 406. The fourth region 404 faces the third region 403 on the opposite side of the second region 402 and may include the sense line 996 illustrated in FIG. 1B. In the sixth region 406 the gate electrodes in the second gate trenches 452 are electrically connected to the gate line 993 through contacts extending from the gate line 993 into the second gate trenches 452.

According to an embodiment, a second termination trench 462 may intersect the second gate trenches 452 in the fourth region 404. For example, the second termination trench 462 may run perpendicular to the second gate trenches 452. The second termination trench 462 includes a second conductive structure electrically connected to the field electrodes in the second gate trenches 452. The second termination trench 462 confines the second body zones 482 of the sense transistor 902 and contributes to a closed design of the sense transistor 902, which provides higher breakdown voltage stability.

A third and a fourth termination trench 463a, 463b may run parallel to the second gate trenches 452 in fifth regions 405 on two opposing long sides of the second region 402. Each of the third and fourth termination trenches 463a, 463b may be structurally connected with the first termination trench 461, the second termination trench 462 or both. Each of the third and fourth termination trenches 463a, 463b includes a third conductive structure 253 electrically connected to the first conductive structure 251 in the first termination trench 461, the second conductive structure in the second termination trench 462, or both. The third termination trenches 463a, 463b confine the second body zones 482 of the sense transistor 902 in a direction perpendicular to the longitudinal direction y and contribute to a closed design of the sense transistor 902 providing higher breakdown voltage stability.

The source electrode 911 as illustrated in FIG. 1B is electrically connected to source zones (not illustrated) and the first body zones 481 formed between the first gate trenches 451 in the first region 401. The sense electrode 992 of FIG. 1B is electrically connected to source zones (not illustrated) and the second body zones 482 formed between the second gate trenches 452 in the second region 402. Both the power and the sense electrodes 911, 992 may include a main layer and an interface layer between the main layer and the semiconductor portion. The interface layer directly adjoins the semiconductor portion and is thinner than the main layer and may contain tungsten.

According to an embodiment, the interface layer includes a contact layer directly adjoining the semiconductor portion, a diffusion barrier layer directly adjoining the contact layer and a fill layer directly adjoining the diffusion barrier layer and filling contact trenches lined by the contact and diffusion barrier layers. The contact layer provides a low contact resistance between the electrode and the source and body zones. The contact layer may be a titanium or tantalum layer or a layer from a titanium or tantalum compound and may have a thickness of 100 nm or less, for example at most 50 nm. The diffusion barrier layer bars metal atoms from diffusing into an underlying dielectric material or into the semiconductor portion, may contain a material selected from titanium nitride or tantalum nitride, by way of example, and may have a thickness of 100 nm or less, for example at most 50 nm. The fill layer may contain tungsten as a main constituent or may consist of tungsten. The fill layer may have a thickness of 200 nm or less, for example at most 150 nm.

According to an embodiment, the interface layer and the main layer are patterned in different patterning processes that may use different lithographic masks, wherein one or both of opposing edges of the main layer of the source electrode and the sense electrode around the sense transistor 902 is/are drawn back from corresponding parallel edges of the interface layer.

For example, the main layer may be absent in the vertical projection of a predetermined number of the outermost second gate trenches 452, for example in the vertical projection of the outermost second gate trench 452 on both long sides of the sensor transistor 902, of the two outermost second gate trenches 452 on each long side, or in the vertical projection of at least three outermost second gate trenches 452 on each long side. A distance between sense transistor cells and power transistor cells can be significantly reduced. The spread of the sense current closer approximates the spread of the load current and area efficiency can be improved.

Figure 2A:
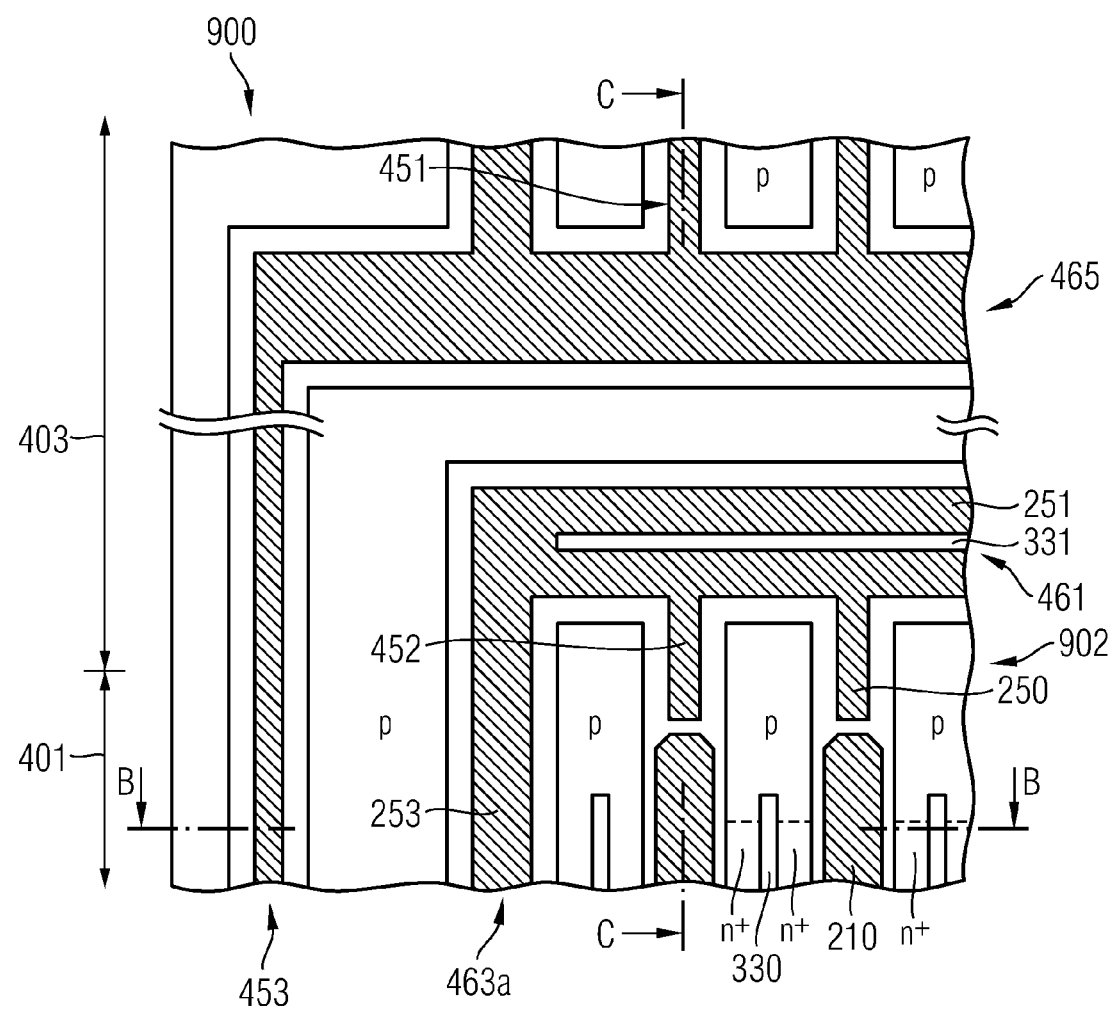
FIG. 2A is a schematic cross-sectional view of a section of an integrated circuit in an edge area of a sense transistor in a plane perpendicular to a current flow in accordance with an embodiment providing sense transistor cells with field electrodes electrically connected to a sense electrode.
Figure 2B:
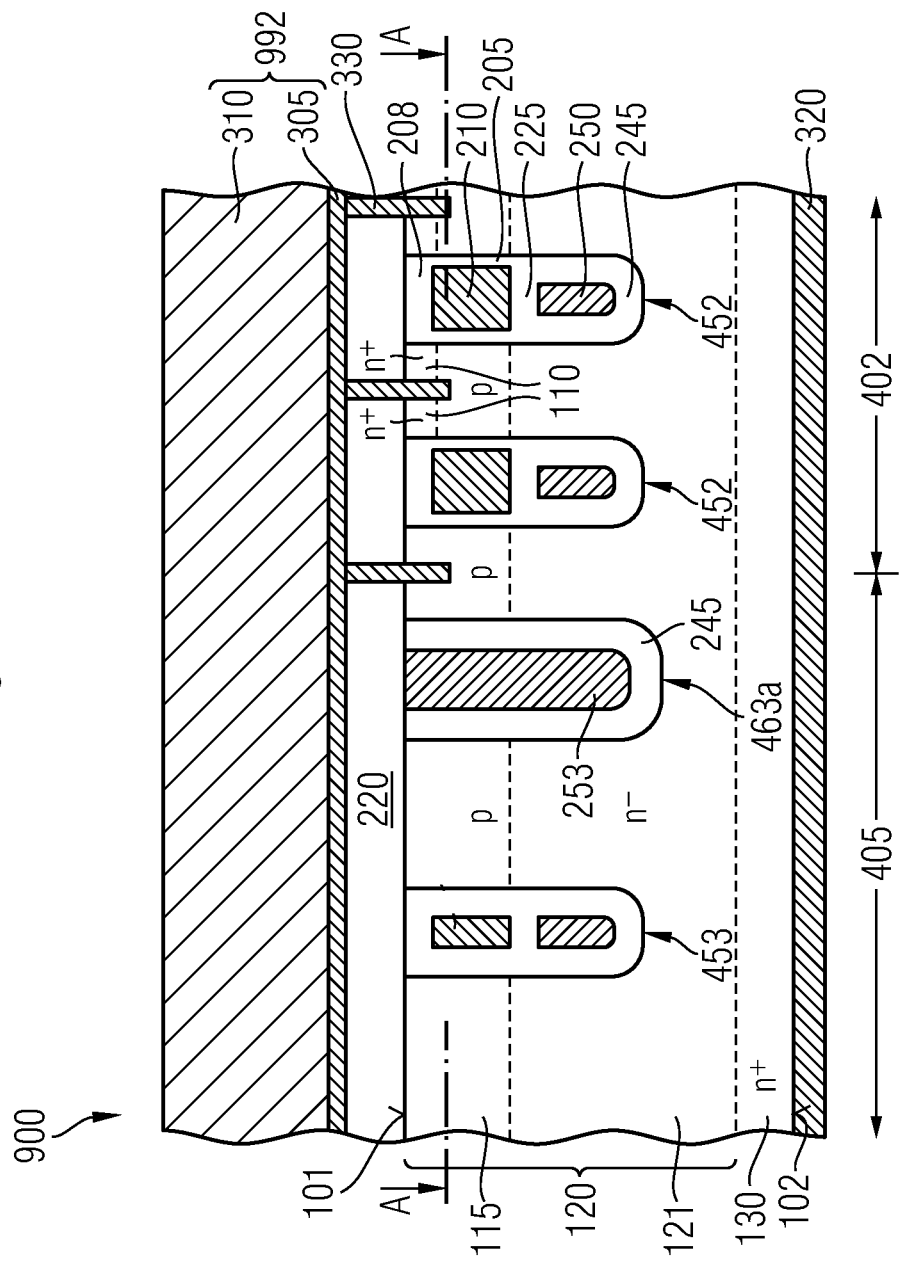
FIG. 2B is a schematic cross-sectional view of the integrated circuit section of FIG. 2A along line B-B.
Figure 2C:
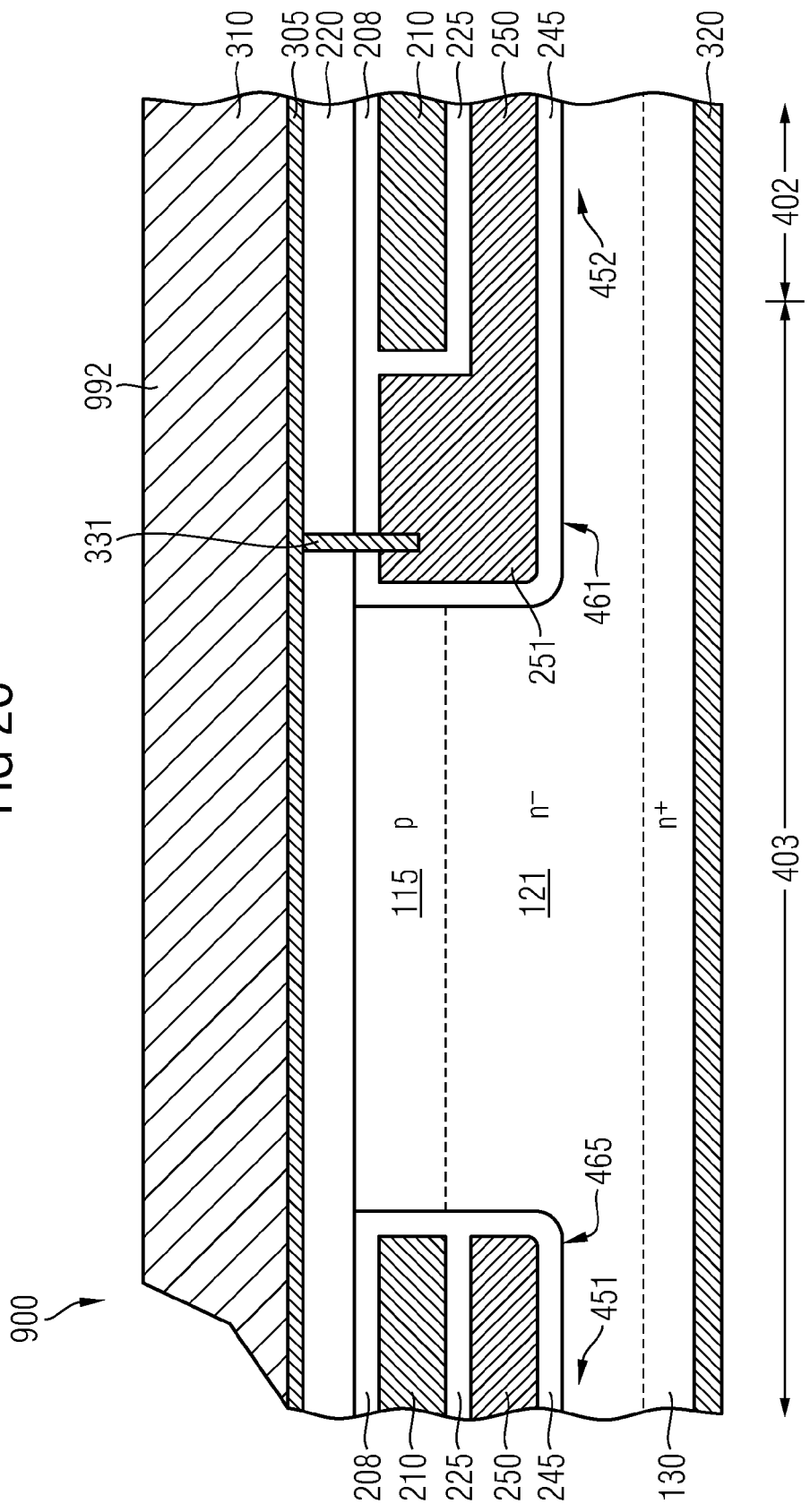
FIG. 2C is a schematic cross-sectional view of the integrated circuit section of FIG. 2A along line C-C.

FIGS. 2A to 2C illustrate an integrated circuit 900 with the second gate trenches 452 structurally separated from the first gate trenches 451, wherein first, second and third gate trenches 451, 452, 453 extend from a first surface 101 into a semiconductor portion 100. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. The first surface 101 may be oriented to a bonding side of the integrated circuit 900. A second surface 102 opposite and parallel to the first surface 101 may be oriented to a soldering side. The semiconductor portion 100 may have a rectangular shape with an edge length in the range of several millimeters. The normal to the first and second surfaces 101, 102 defines a vertical direction and directions orthogonal to the normal direction and parallel to the first and second surfaces 101, 102 are lateral directions.

The semiconductor portion 100 includes a drain layer 130 that may extend along the complete second surface 102 and a semiconductor layer 120 with a drift zone 121. The drain layer 130 and the drift zone 121 have the same, first conductivity type. An impurity distribution in the drain layer 130 is approximately uniform and a mean impurity concentration in the drain layer 130 is comparatively high, e.g. at least $5\times10^{18}$ cm$^{-3}$. The semiconductor layer 120 directly adjoins the first surface 101 and forms a junction interface with the drain layer 130, which is parallel to the second surface 102. A mean impurity concentration in the drift zone 121 is at least ten times lower than the mean impurity concentration in the drain layer 130. A comparatively sharp step in the vertical impurity profile marks the junction interface between the drain layer 130 and the drift zone 121.

A drain electrode 320 provided on the second surface 102 in direct contact with the drain layer 130 may contain, as main constituent(s), nickel Ni, titanium Ti, silver Ag, gold Au, platinum Pt and/or palladium Pd. For example, the drain layer 130 may include two or more sub-layers, each sub-layer containing one or more of Ni, Ti, Ag, Au, Pt, and Pd as main constituent(s) and/or alloys therefrom.

The stripe-shaped gate trenches 451-453 include field electrodes 250 and gate electrodes 210. A field dielectric 245 dielectrically insulates the field electrodes 250 from the surrounding semiconductor material of the semiconductor portion 100. In each gate trench 451-453 the gate electrode 210 is arranged between the first surface 101 and the field electrode 250. A gate dielectric 205 separates and dielectrically insulates the gate electrodes 210 from the material of the semiconductor portion 100. An intermediate dielectric 225 dielectrically insulates the gate electrodes from the field electrodes 250. A top dielectric 208 may be provided in the gate trenches 451-453 between the gate electrodes 210 and a plane spanned by the first surface 101.

The field dielectric 245 may be formed by thermal oxidation of the semiconductor material of the semiconductor portion 100. The field and gate electrodes 250, 210 may contain heavily doped deposited semiconductor material, for example heavily doped polycrystalline silicon. The intermediate dielectric 225 and the top dielectric 208 may be thermally grown oxides from the material of the field and gate electrodes 250, 210 or deposited dielectrics. The gate dielectric 205 may include thermally grown oxide or nitride and/or deposited dielectric material.

Body zones 115 of a second conductivity type, which is complementary to the first conductivity type 115 form first pn junctions with the drift zone 121, wherein the first pn junctions are approximately parallel to the first and second surfaces 101, 102. The first pn junctions may be aligned to a buried edge of the gate electrodes 210 oriented to the second surface 102. Source zones 110 of the first conductivity type extend from the first surface 101 into the semiconductor portion 100 between first and second gate trenches 451, 452 and form second pn junctions with the body zones 115. The second pn junctions are approximately aligned with an upper edge of the gate electrodes 451, 452 oriented to the first surface 101. The source zones 110 may be formed by a masked implant exclusively between neighboring pairs of the first and second gate trenches 451, 452.

A dielectric layer 220 may be provided on the first surface 101. The dielectric layer 220 may include one or more sub-layers, for example an adhesion layer, a buffer layer and/or a diffusion barrier layer and/or a cover layer. According to an embodiment, the dielectric layer 220 includes a thermally grown silicon oxide layer that may be formed contemporaneously with the gate dielectric 205 and/or the top dielectric 208. The dielectric layer 220 may further include a diffusion barrier layer, for example a silicon nitride or silicon oxynitride layer. A thin silicon oxide layer, which may be provided from deposited oxide, for example using TEOS (tetraethylorthosilane) as precursor material, or a silicate glass, for example undoped silicate glass, may provide an adhesive or buffer layer. The cover layer may be provided from BSG (boron silicate glass), PSG (phosphorus silicate glass) or BPSG (boron phosphorus silicate glass). Other embodiments may provide less or more sub-layers.

The semiconductor layer 120 may include further impurity zones, conductive structures, and/or insulator structures. For example, the semiconductor layer 120 may include a super junction structure with successively arranged p-doped and n-doped columns for achieving a compensation effect improving the reverse voltage blocking capability of the semiconductor layer without increasing the on-state resistance.

The illustrated embodiments refer to n-FETs (n-channel field effect transistors) with the first conductivity type being the n-type. Equivalent considerations apply for p-FETs (p-channel FETs) with the first conductivity type being the p-type.

As yet illustrated in FIG. 10, in a first region 401a source electrode 911 is electrically connected to the source and body zones 110, 115 between the first gate trenches 451. A sense electrode 992 is electrically connected to the source zones 110 and the body zones 115 in a second region 402 through cell contacts 330 extending through the dielectric layer 220 into the semiconductor portion 100.

Each of the source and sense electrodes 911, 992 may include an interface layer 305 and a main layer 310. The cell contacts 330 are formed from the material(s) of the interface layer 305 that is a thin layer of several 10 nm above the dielectric layer 220. Both the cell contacts 330 and the interface layer 305 may include tantalum Ta, titanium Ti and/or tungsten W as main constituent or as one of the main constituents. The cell contacts 330 and the interface layer 305 may have a layered structure. For example, the cell contacts 330 and the interface layer 305 may include a sequence of a contact layer, e.g. Ti, a diffusion barrier layer, e.g. TiN, and a fill layer, e.g. tungsten W.

The main layer 310 may be provided from aluminum Al, copper Cu, an aluminum copper alloy AlCu and may or may not contain silicon. The main layer 310 may have a thickness of at least 1 μm, for example at least 3 μm.

In a third region 403 between the first and the second regions 401, 402 a first termination trench 461 intersects the second gate trenches 452, e.g. orthogonally. The first termination trench 461 includes a first conductive structure 251 that is structurally and electrically connected to the field electrodes 250 in the second gate trenches 452. The first termination trench 461 may be wider and may extend deeper into the semiconductor portion 100 than the first and second gate trenches 451, 452.

A first contact 331 extends through the dielectric layer 220 and electrically connects the sense electrode 992 via the conductive structure 251 in the first termination trench 461 with the field electrodes 250 in the second region 402. The first contact 331 may have the same composition as the cell contacts 330. Since the first gate trenches 451 are separated from the second gate trenches 452, the field electrodes 250 of the sense transistor 902 formed in the second region 402 are dielectrically insulated from the field electrodes 250 of the power transistor 901 formed in the first region 401.

As depicted in FIG. 1C, a second termination trench 462 may be provided outside the illustrated section. Each second termination trench 462 includes a second conductive structure 252 which may be electrically connected to the field electrodes 250 in the second gate trenches 452 through the first conductive structure 251 in the first termination trench 461. Third termination trenches 463a, 463b may extend parallel to the second gate trenches 452 along two opposing long sides of the second region 402.

A fifth termination trench 465 may intersect, e.g. orthogonally, the first gate trenches 451 and a third gate trench 453 running parallel to the second gate trenches 452 such that gate electrodes 210 in the first gate trenches 451 can be electrically connected to the same gate line (gate finger) to which the gate electrodes 210 in the second gate trenches 452 are connected.

The first, second and third termination trenches 461, 462, 463a, 463b surround and moat the second region 402 such that the body zones 115 within the second region 402 are separated from body zones 115 outside the second region 402. The sense transistor 902 is closed without using an implant mask for the formation of the body zones 115.

Figure 3A:
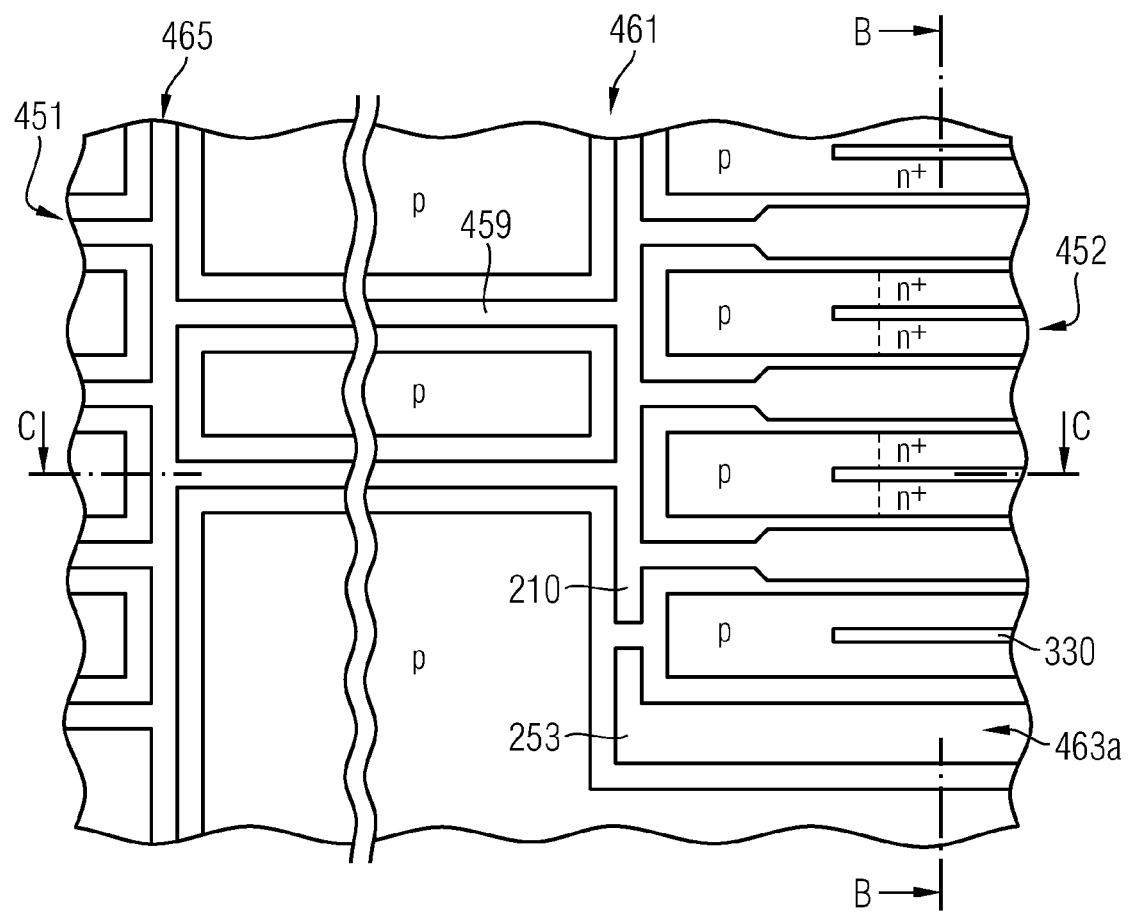
FIG. 3A is a schematic cross-sectional view of a section of an integrated circuit in an edge area of a sense transistor in a plane perpendicular to a current flow in accordance with an embodiment with the field electrodes of the sense transistor being connected with the field electrodes of a power transistor.
Figure 3B:
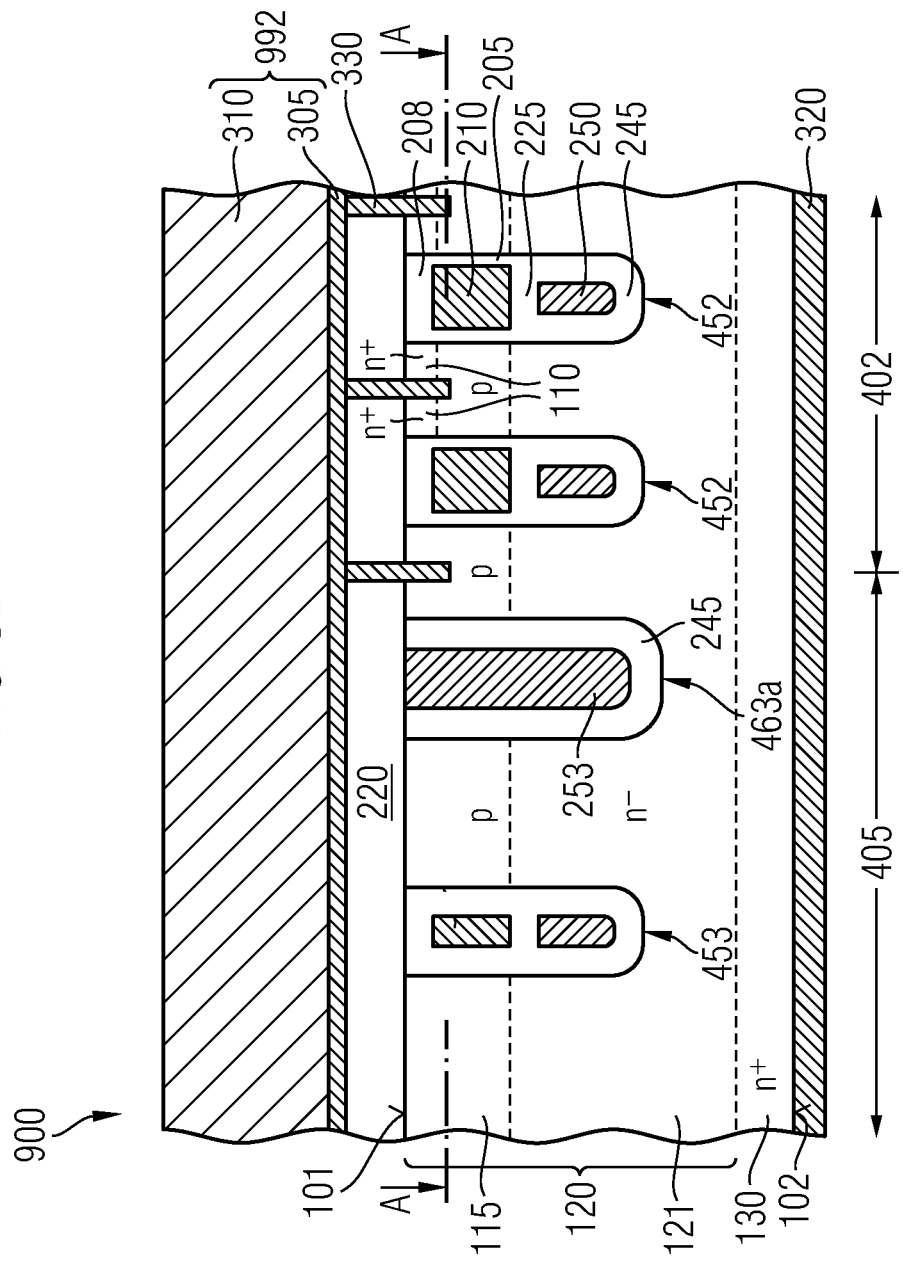
FIG. 3B is a schematic cross-sectional view of the section of the integrated circuit according to FIG. 3A along line B-B.
Figure 3C:
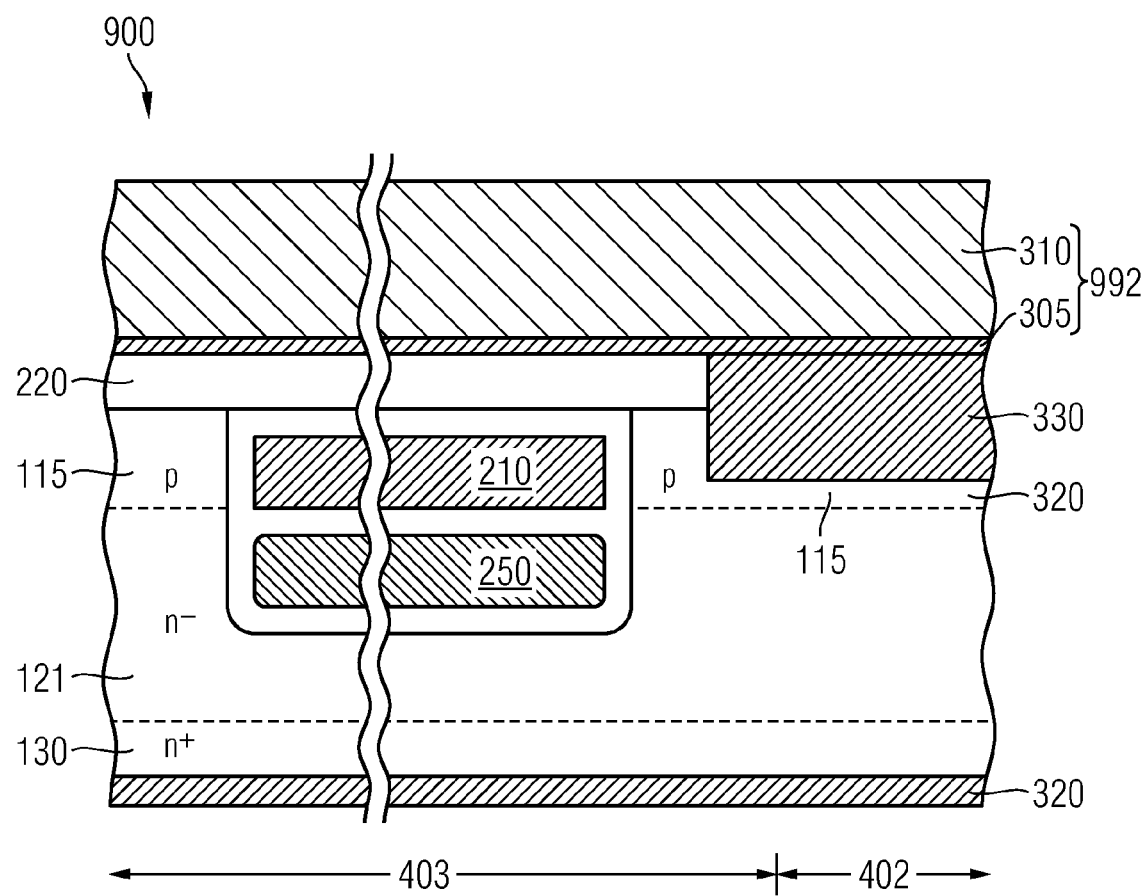
FIG. 3C is a schematic cross-sectional view of the section of the integrated circuit according to FIG. 3A along line C-C.

The embodiment of FIGS. 3A to 3C differs from the embodiment of FIGS. 2A to 2C in that connection trenches 459 structurally connect the first and fifth termination trenches 461, 465 such that the field electrodes 250 and gate electrodes 210 of the power transistor 901 in the first region 401 are electrically connected with the field electrodes 250 and gate electrodes 210 of the sense transistor 902 in the second region 402. Since the same capacity is effective for the field electrodes 250 of the power and sense transistors 901, 902 the sense transistor 902 more accurately reproduces the dynamic characteristics of the power transistor 901. As a further consequence, a degradation of the sense transistor 902 due to avalanche events may closer follow the degradation of the power transistor 901 over time.

Figure 4A:
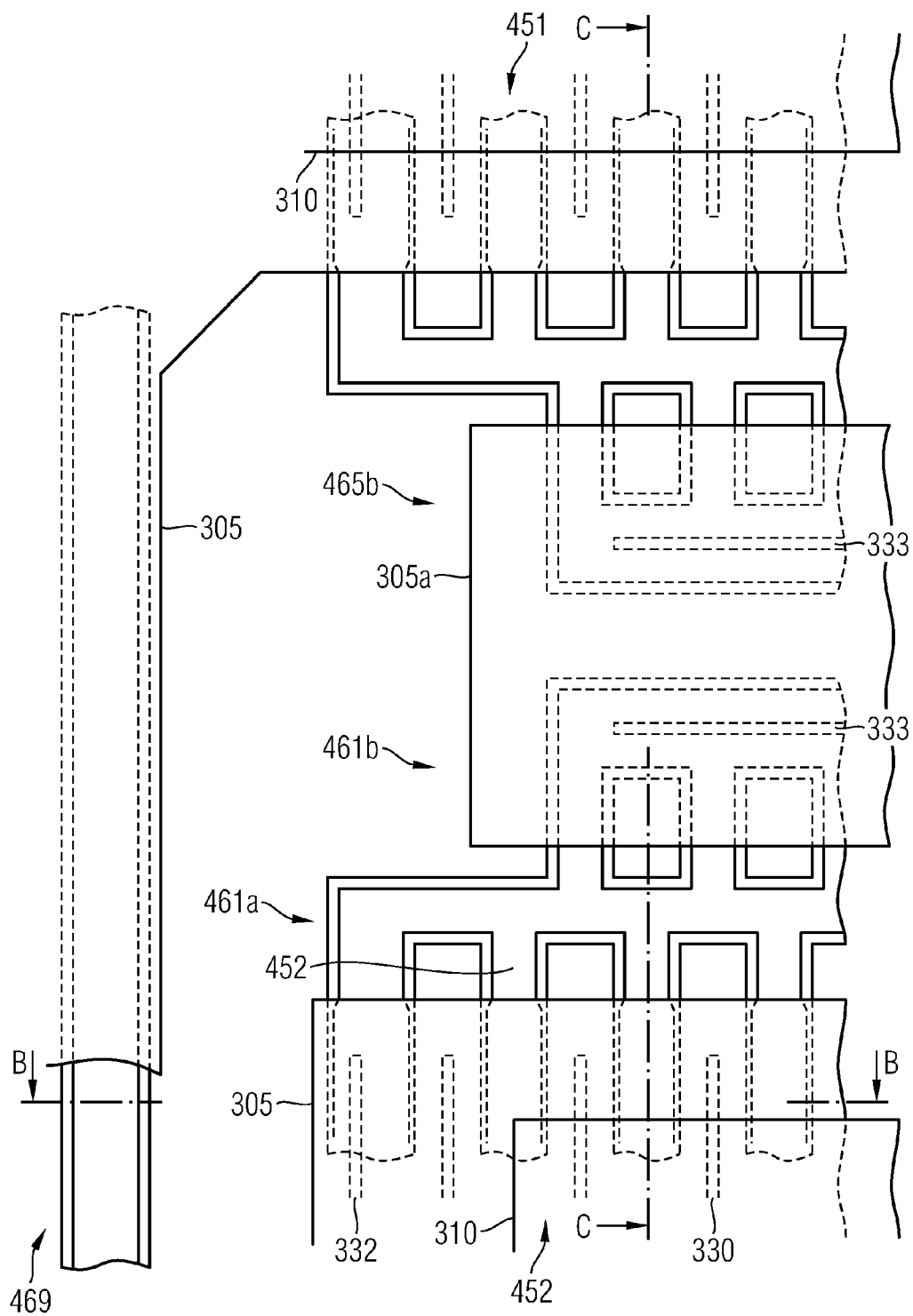
FIG. 4A is a schematic cross-sectional view of a section of an integrated circuit in an edge area of a sense transistor in a plane perpendicular to a current flow in accordance with an embodiment providing a gate bridge.
Figure 4B:
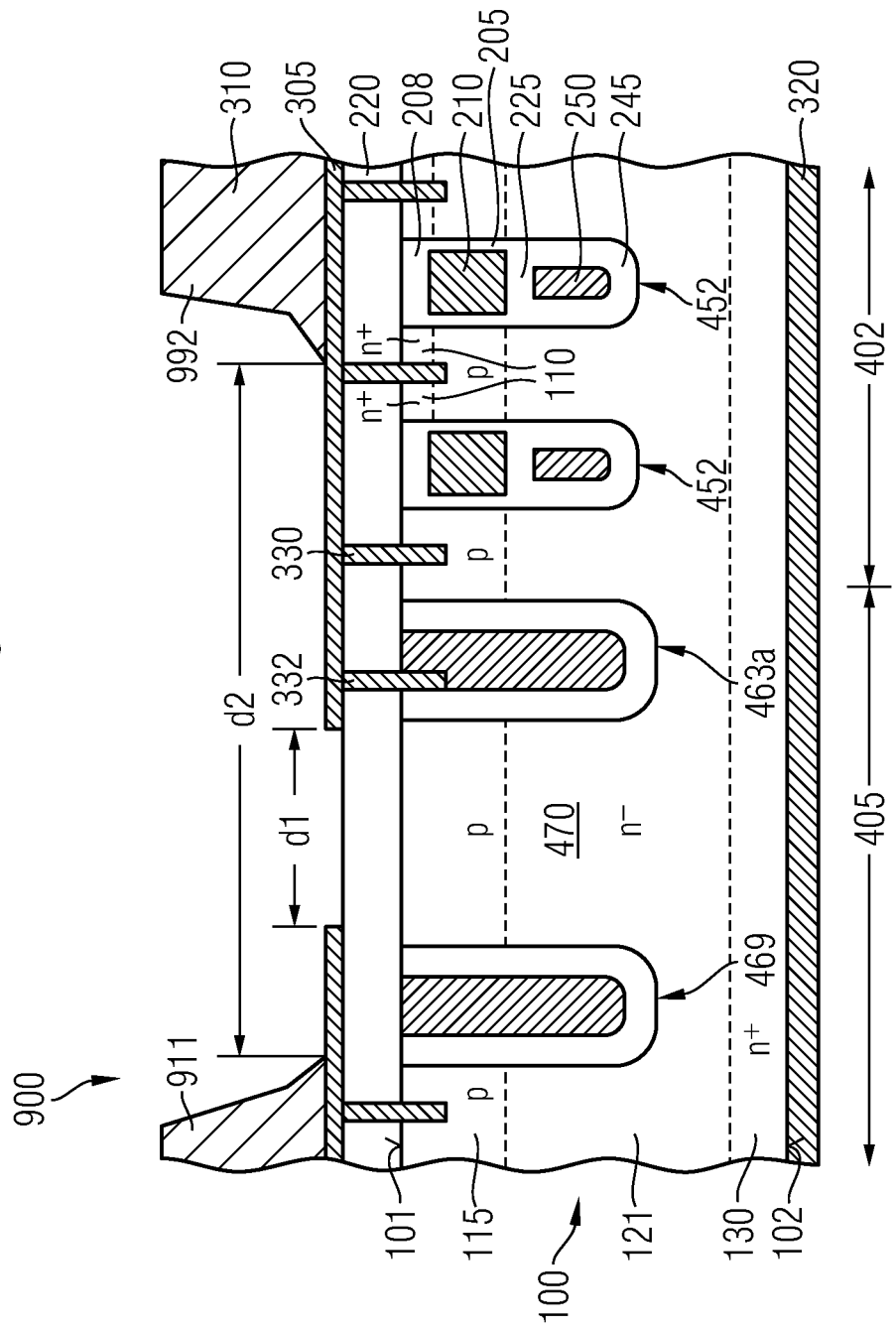
FIG. 4B is a schematic cross-sectional view of the integrated circuit according to FIG. 4A along line B-B.
Figure 4C:
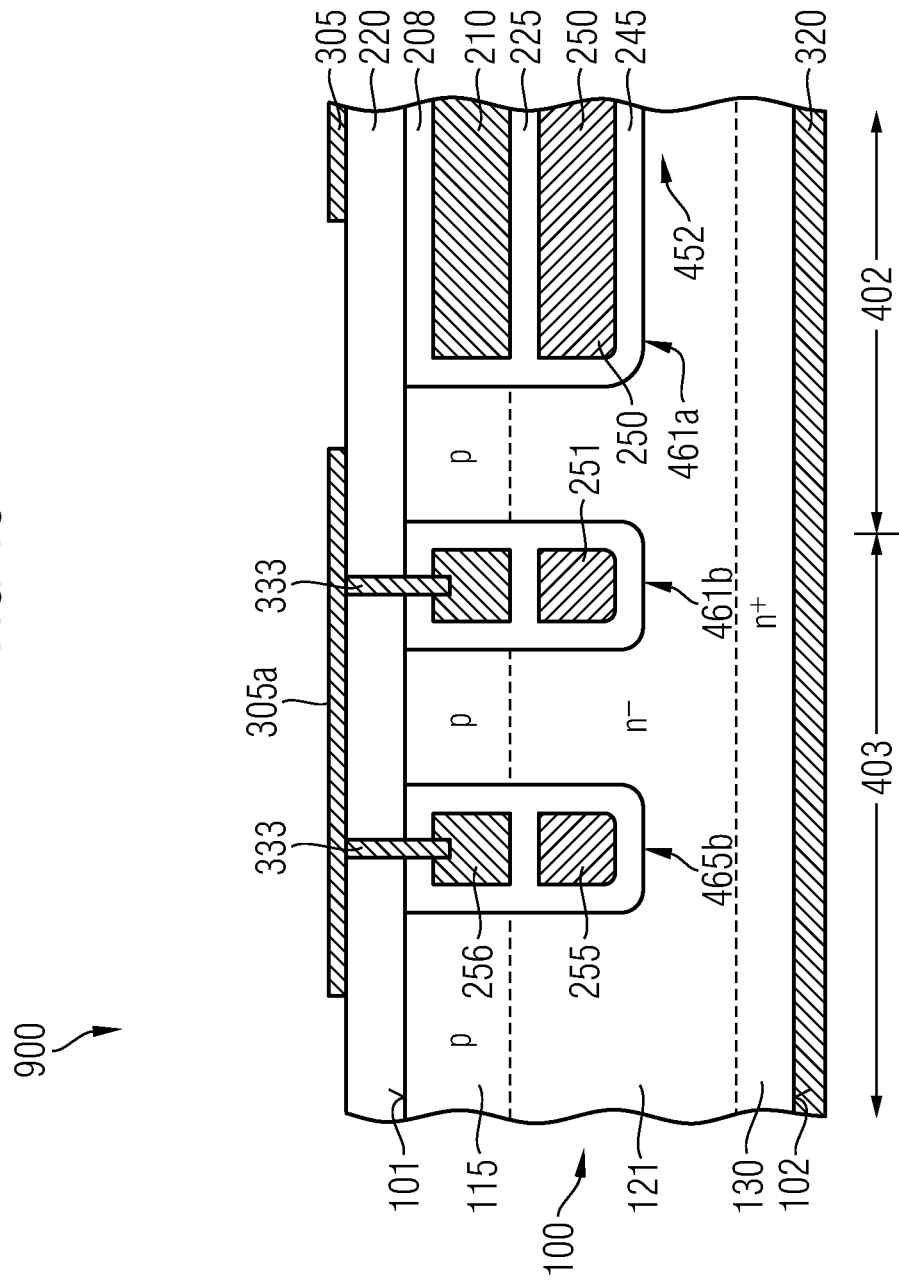
FIG. 4C is a schematic cross-sectional view of the integrated circuit according to FIG. 4A along line C-C.

Similar as the embodiment of FIGS. 2A to 2C, the embodiment according to FIGS. 4A to 4C provides the field electrodes 250 of the sense transistor 902 to be electrically connected with the sense electrode 992 and dielectrically insulated from the field electrodes 250 of the power transistor 901.

The integrated circuit 900 of FIGS. 4A to 4C is based on a separate processing of the main layer 310 and the interface layer 305 of the source and sense electrodes 911, 992. The interface layer 305 and the main layer 310 are patterned in different patterning processes that may use different lithographic masks, wherein one or both of opposing edges of the main layer 310 of the source electrode 911 and the sense electrode 992 around the sense transistor 902 is/are drawn back from corresponding parallel edges of the interface layer 305. Source, sense and gate terminals as well as sense and gate lines as illustrated in FIG. 1B may emerge from the same patterning steps applied for the sense and source electrodes 911, 992.

After depositing a first continuous layer, which may include two or more sub-layers, the first continuous layer is patterned by photolithography to form isolated sections of the interface layer 305. Since the first continuous layer is comparatively thin with a total thickness well below 300 nm, or even less than 150 nm, a first minimum width d1 of gaps between isolated segments of the patterned interface layer 305 may be 1 μm or less. A second continuous layer of the material of the main layer 310 is deposited and patterned by photolithography to form separated segments of the main layer 310, wherein each segment of the main layer 310 is formed in the vertical projection of one of the isolated segments of the interface layer 305. Since the main layer 310 is comparatively thick, e.g. more than 1 μm and includes metals like Al and/or Cu for which conventional etch processes provide only comparatively low aspect ratios, a second minimum width d2 of gaps between separated segments of the main layer 310 may be at least 10 μm, e.g. about 20 μm.

Other than the interface layer 305, the main layer 310 may be absent in the vertical projection of a predetermined number of the outermost second gate trenches 452. According to an embodiment, the main layer 310 is absent in the vertical projection of the outermost second gate trenches 451 on the two opposing long sides of the second region 402. According to another embodiment, the main layer 310 is absent in the vertical projection of the outermost gate second gate trench 452 on each of both long sides of the sensor transistor 902, of the two outermost second gate trenches 452 on each long side, or in the vertical projection of at least three outermost gate trenches on each long side.

A distance between the long side third and fourth termination trenches 463a, 463b and parallel termination trenches 469 of neighboring power transistor cells may be less than a minimum width allowing a further gate trench to pass through a fifth region 405 between the long side termination trenches 463a, 463b of the sense transistor 902 and the neighboring termination trenches 469 of the power transistor 901.

Referring again to FIG. 10 fourth gate trenches 454 assigned to the power transistor 901 may run parallel to the second gate trenches 452 in a seventh region 407, wherein the seventh region 407 neighbors the second region 402 in a direction perpendicular to the longitudinal direction. A distance between the outermost second gate trench 452 and the closest fourth gate trench 454 is at most 10 times and at least 3 times, e.g. about 5 times, the distance between two neighboring second gate trenches 452. According to an embodiment, the distance may be between 2.5 μm and 8 μm, for example about 5 μm.

For connecting the sense electrode 992 with the field electrodes 250 of the sense transistor 902, at least one second contact 332 extends from the sense electrode 992 into at least one of the third and fourth termination trenches 463a, 463b. One, two, four or more second contacts 332 may extend into the third and fourth termination trenches 463a, 463b. According to an embodiment one second contact 332 extends into the third termination trench 463a and one further second contact 332 extends into the fourth termination trench 463b, wherein the two second contacts 332 may be provided close a center of the long sides of the second region 402.

According to another embodiment, two or more second contacts 332 extend into the third termination trench 463a and two or more further second contacts 332 extend into the fourth termination trench 463b, wherein four second contacts 332 may be provided close to the corners of the second region 402. The second contacts 332 may have the same composition as the cell contacts 330.

For connecting the gate electrodes 210 in the first gate trenches 451 in the first region 401 to a gate line 993 in the sixth region 406, which is on the opposing side of the second region 402 as illustrated in FIG. 10, an isolated portion of the interface layer 305 forms a gate bridge 305a.

A fifth termination trench 465 intersects the first gate trenches 451 in the third region 403. The fifth termination trench 465 may include a fifth conductive structure 255 structurally and electrically connected to the field electrodes 250 in the first gate trenches 451 and a sixth conductive structure 256 structurally and electrically connected to the gate electrodes 210 in the first gate trenches 451. Each of the first and fifth termination trenches 461, 465 may have two or more parallel branches 461a, 461b and 465a, 465b that are electrically and structurally connected to each other, respectively.

The gate bridge 305a includes third contacts 333 extending into neighboring branches 465b, 461b of the first and fifth termination trenches 461, 465. A mesa section 470 of the semiconductor portion 100 separates the first and fifth termination trenches 461, 465.

Figure 5A:
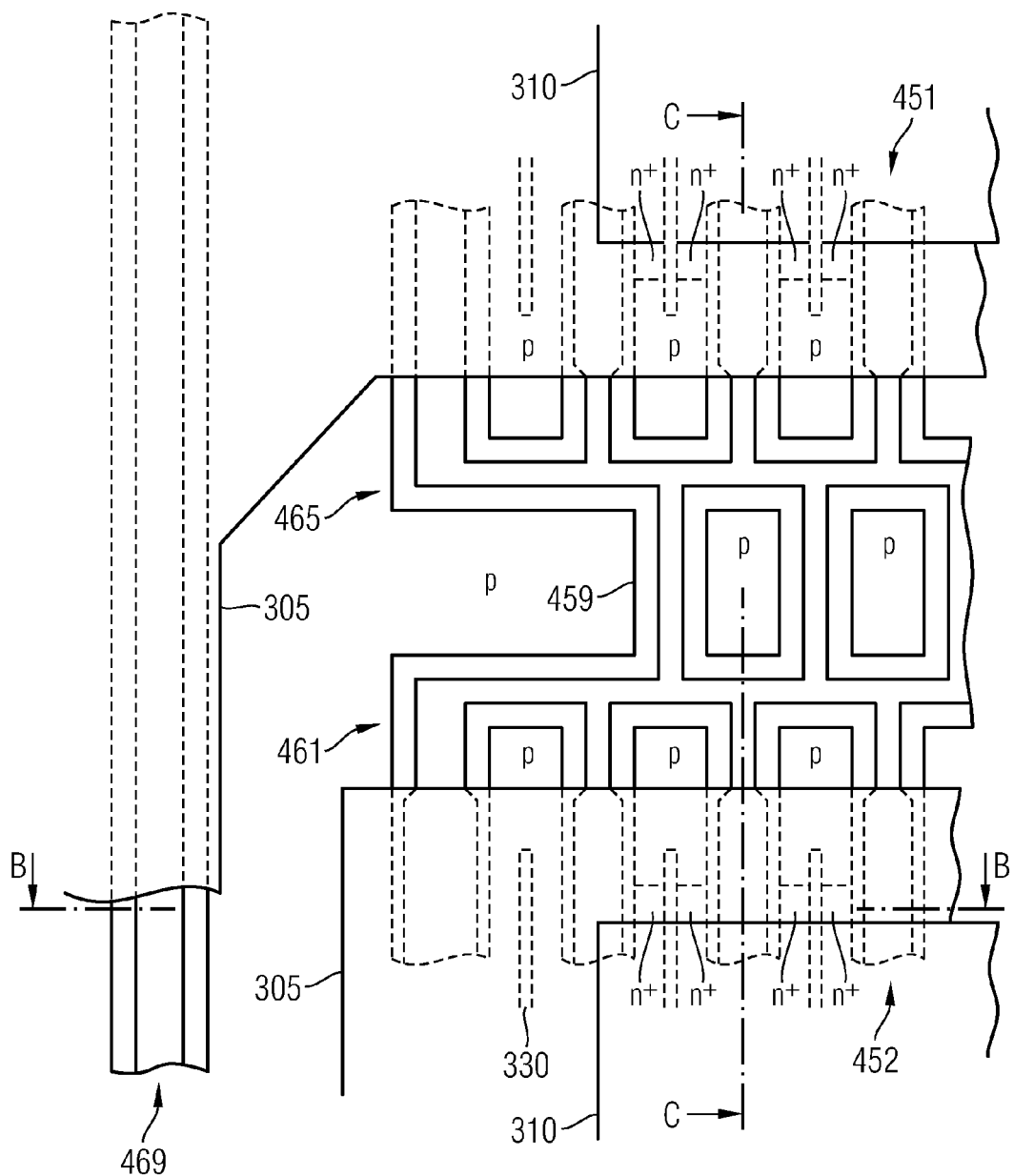
FIG. 5A is a schematic cross-sectional view of a section of an integrated circuit in an edge area of a sense transistor in a plane perpendicular to a current flow in accordance with a further embodiment providing separate patterning of an interface layer and a main layer of sense and source electrodes.
Figure 5B:
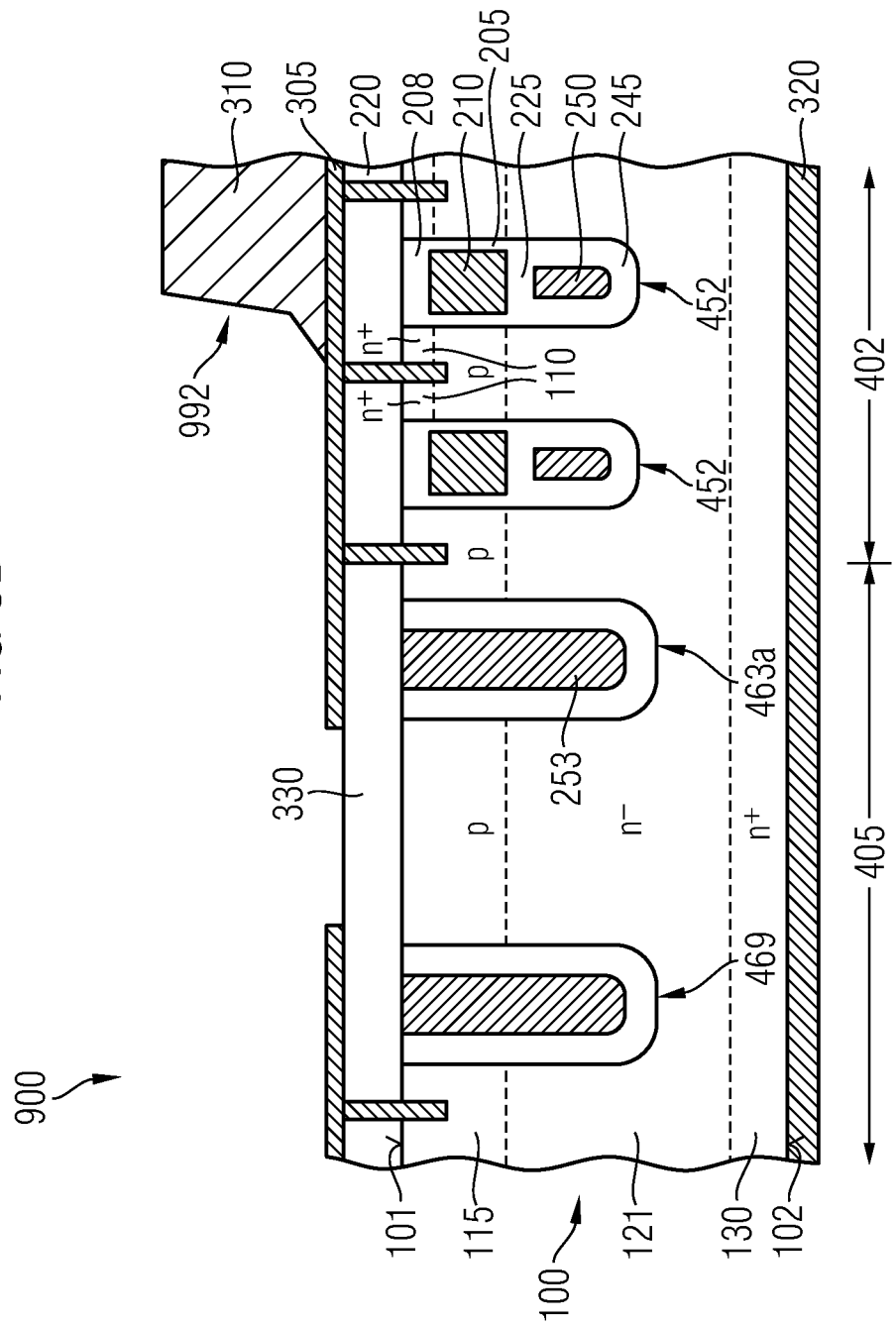
FIG. 5B is a schematic cross-sectional view of the integrated circuit section of FIG. 5A along line B-B.
Figure 5C:
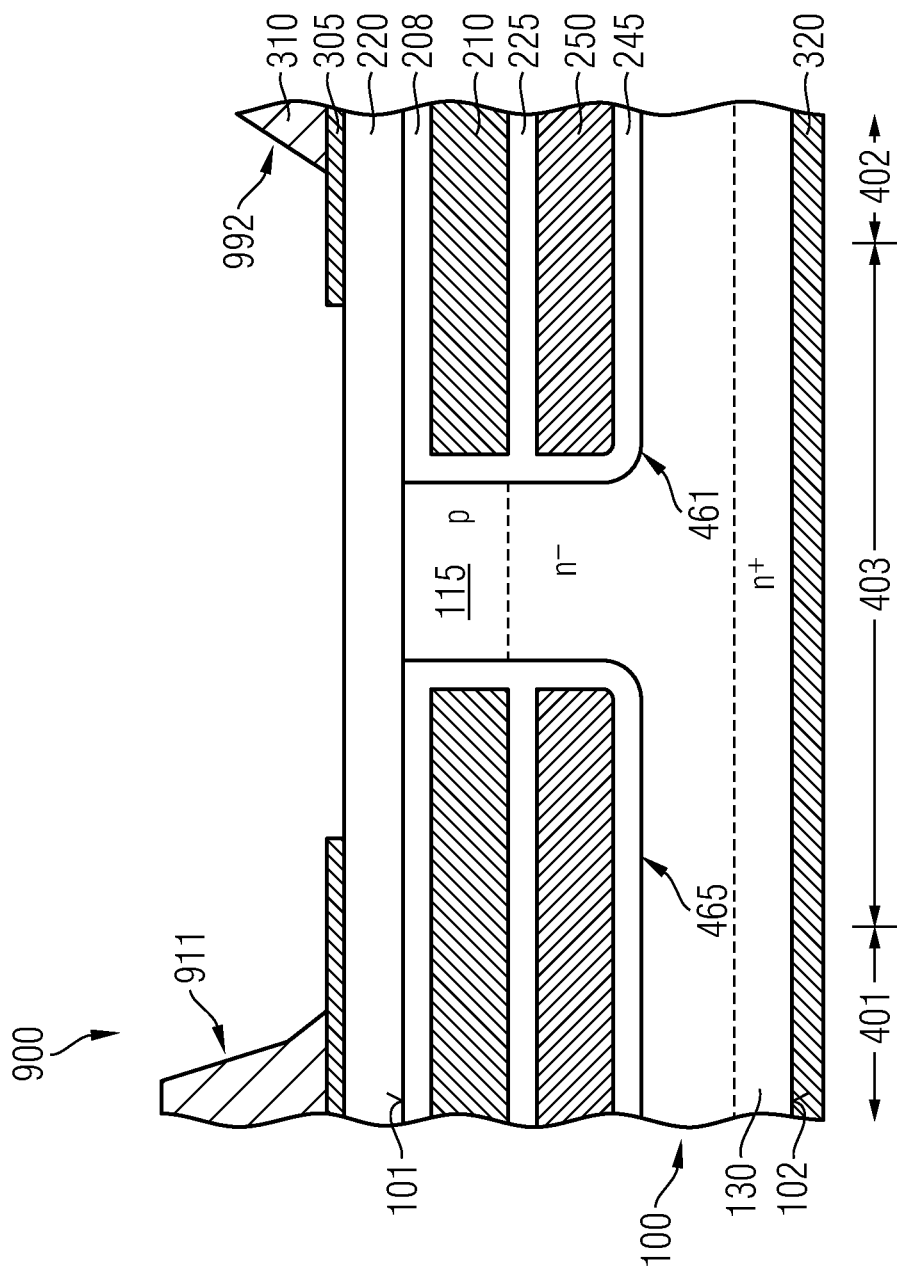
FIG. 5C is a schematic cross-sectional view of the integrated circuit section of FIG. 5A along line C-C.

In the embodiment of FIGS. 5A to 5C a connection field plate with connection trenches 459 as described with reference to FIGS. 3A to 3C replace the second and third contacts 332, 333 as well as the gate bridge 305a of the embodiment of FIGS. 4A to 4C.

With the embodiments of FIGS. 4A to 5C a distance between the power and sense transistor cells is significantly decreased with regard to conventional designs. With decreasing distance between the power transistor 901 and the sense transistor 902 a spread of the sense current into the surrounding regions is reduced and more precisely approximates the spread of the load current in the power transistor cells. As a consequence the on-state resistance Ron of the sense transistor 902 more precisely reflects the on-state resistance Ron of the power transistor 901 and the load current estimation becomes more precise.

FIG. 6 is a further cross-sectional view of the embodiments of FIGS. 2A to 3C in a plane perpendicular to the second gate trenches 452. Termination trenches 463a, 463b, 469 provide a closed layout for the power and sense transistors 901, 902 with second gate trenches 452 and fourth gate trenches 454. In fifth regions 405 between the sense transistor 902 and the power transistor 901 third gate trenches 453 run parallel to the second gate trenches 452 and provide an electrical connection between gate lines running in the foreground and gate electrodes in first gate trenches running in the projection of the second gate trenches in the background. According to embodiments providing a further metallization plane, an interlayer dielectric 390 may cover at least portions of the source and sense electrodes 911, 992.

Figure 7A:
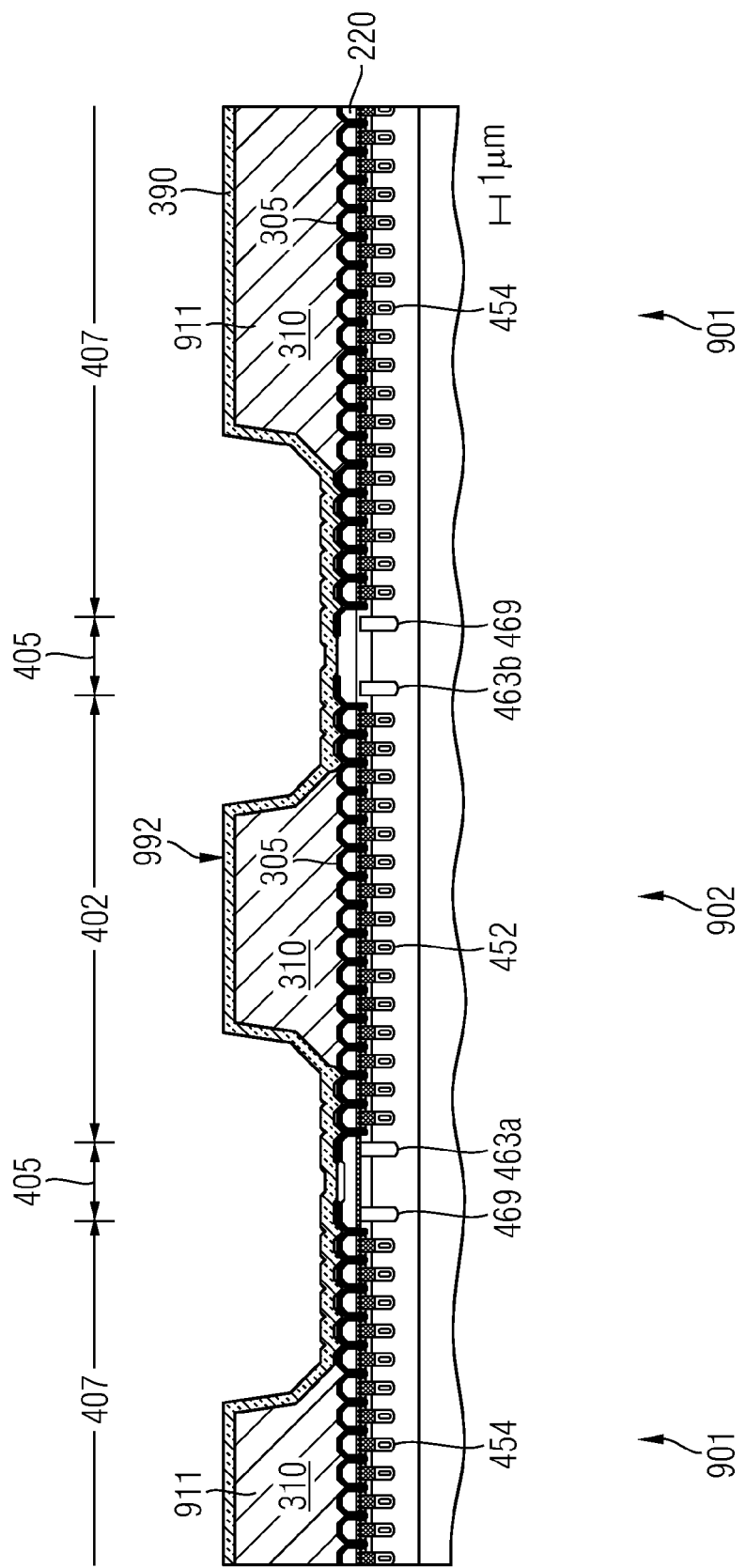
FIG. 7A is a schematic cross-sectional view of a section of an integrated circuit perpendicular to the gate trenches in accordance with an embodiment providing a sense electrode with separately patterned interface and main layers.
Figure 7B:
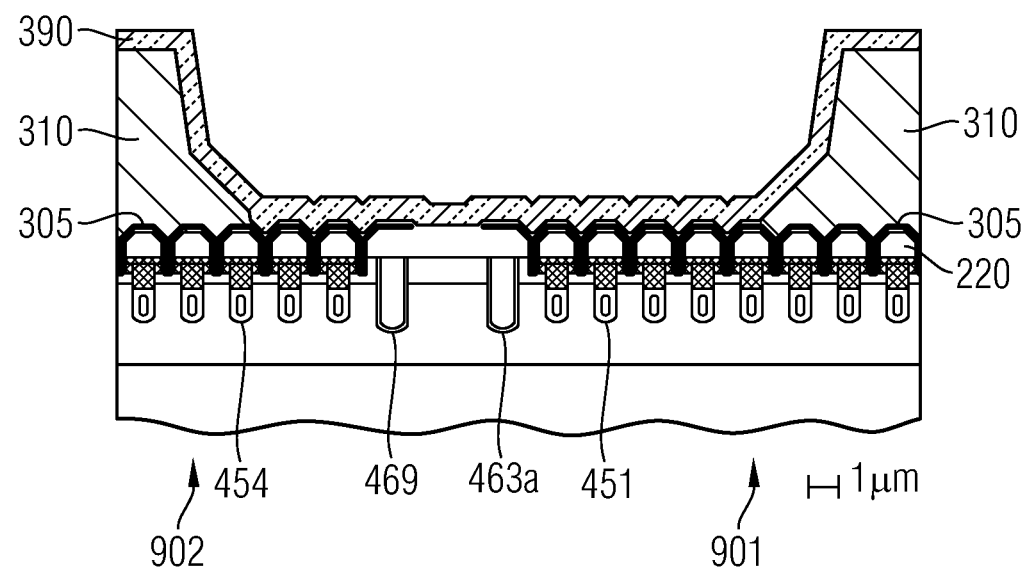
FIG. 7B shows a section of FIG. 7A in more detail.

FIGS. 7A and 7B are further cross-sectional views of the embodiments of FIGS. 4A to 5C in a plane perpendicular to the second gate trenches 452. The edges of the main layer 310 of the source and sense electrodes 911, 992 are drawn back from the corresponding edges of the interface layer 305 allowing the sense transistor 902 to be arranged closer to the power transistor 901.

FIG. 8 refers to a method of manufacturing an integrated circuit. A first continuous layer that contains tungsten is provided on a semiconductor portion with buried gate and field electrodes that extend in a longitudinal direction in a first region (802). The first continuous layer is patterned, wherein an interface layer is obtained that includes an isolated segment covering the first region (804). A second continuous layer is provided that contains at least one of copper and aluminum (806). The second continuous layer is patterned to obtain a main layer with a separated segment covering a first portion of the isolated segment of the interface layer and leaving uncovered a second portion of the isolated segment (808).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising a semiconductor portion, the semiconductor portion comprising:
   a power transistor including first gate trenches crossing a first region and a sense transistor including second gate trenches crossing a second region, wherein each gate trench extends in a longitudinal direction and comprises a gate electrode and a field electrode and wherein the first and second regions are arranged along the longitudinal direction given by a longitudinal axis of the gate trenches; and
   a first termination trench intersecting at least the second gate trenches in a third region separating the first and second regions, the first termination trench including a first conductive structure electrically connected to the field electrodes in the second gate trenches.

2. The integrated circuit according to claim 1, wherein the first and second gate trenches are arranged in a regular stripe pattern.

3. The integrated circuit according to claim 1, wherein the first termination trench extends deeper into the semiconductor portion than the gate trenches.

4. The integrated circuit according to claim 1, comprising:
   a second termination trench intersecting the second gate trenches in a fourth region that faces the third region on the opposite side of the second region, the second termination trench including a second conductive structure electrically connected to the field electrodes in the second gate trenches.

5. The integrated circuit according to claim 1, comprising:
   a third and a fourth termination trench extending parallel to the second gate trenches along two opposing long sides of the second region, each of the third and fourth termination trenches connected with the first termination trench and each of the third and fourth termination trenches including a third conductive structure electrically connected to the first conductive structure in the first termination trench.

6. The integrated circuit according to claim 1, comprising:
   a second termination trench intersecting the second gate trenches in a fourth region that faces the third region on the opposite side of the second region, the second termination trench including a second conductive structure electrically connected to the field electrodes in the second gate trenches, and
   a third and a fourth termination trench extending parallel to the second gate trenches along two opposing long sides of the second region, each of the third and fourth termination trenches connected with the first and second termination trenches and each of the third and fourth termination trenches including a third conductive structure electrically connected to the first conductive structure in the first termination trench.

7. The integrated circuit according to claim 1, comprising:
   a power electrode electrically connected to body and source zones formed between the first gate trenches in the first region;
   a sense electrode electrically connected to body and source zones formed between the second gate trenches in the second region.

8. The integrated circuit according to claim 7, wherein the first termination trench separates the body zones in the first region from body zones outside the first region.

9. The integrated circuit according to claim 7, wherein the sense electrode comprises a main layer and an interface layer between the main layer and the semiconductor portion, the interface layer directly in contact with the semiconductor portion and being thinner than the main layer.

10. The integrated circuit according to claim 9, wherein the interface layer comprises tungsten.

11. The integrated circuit according to claim 9, wherein the interface layer comprises a diffusion barrier layer containing a material selected from a group comprising titanium nitride and tantalum nitride.

12. The integrated circuit according to claim 7, wherein the first conductive structure in the first termination trench is electrically connected to the sense electrode and dielectrically insulated from the field electrodes in the first gate trenches.

13. The integrated circuit according to claim 12, wherein the first conductive structure fills the first termination trench between a top dielectric adjoining a plane spanned by first surface of the semiconductor portion and wherein a field dielectric separates the first conductive structure and the semiconductor portion.

14. The integrated circuit according to claim 13, wherein a first contact extends from the interface layer into the first termination trench and electrically connects the interface layer and the first conductive structure.

15. The integrated circuit according to claim 7, wherein the first conductive structure in the first termination trench is electrically connected to the field electrodes in the first gate trenches.

16. The integrated circuit according to claim 15, wherein the first termination trench is structurally connected with the first gate trenches.

17. The integrated circuit according to claim 7, comprising:
a third and a fourth termination trench extending parallel to the second gate trenches along two opposing long sides of the second region, the third and fourth termination trenches including a third conductive structure electrically connected to the first conductive structure in the first termination trench, and at least one second contact extending from the interface layer into at least one of the third and fourth termination trenches and electrically connecting the interface layer and the third conductive structure.

18. The integrated circuit according to claim 17, wherein at least one second contact extends from the interface layer into the third termination trench and at least one second contact extends from the interface layer into the fourth termination trench.

19. The integrated circuit according to claim 17, comprising:
- a fifth termination trench intersecting the first gate trenches in the third region, the fifth termination trench including a conductive structure electrically connected to the field electrodes in the first gate trenches,
- a gate bridge formed in an isolated section of the interface layer, and
- at least one third contact extending from the interface layer into a first termination trench and at least one fourth contact extending from the interface layer into the fifth termination trench, wherein the gate bridge electrically connects the gate electrodes in the first gate trenches with the gate electrodes in the second gate trenches.

20. The integrated circuit according to claim 19, wherein a mesa section of the semiconductor portion separates the first and third termination trenches.

21. The integrated circuit according to claim 9, wherein the interface layer is provided in the vertical projection of all second gate trenches and the main layer is absent in the vertical projection of at least an outermost second gate trench.

22. The integrated circuit according to claim 21, wherein the interface layer is provided in the vertical projection of all second gate trenches and the main layer is absent in the vertical projection of at least two outermost second gate trenches on each long side of the first region parallel to the second gate trenches.

23. The integrated circuit according to claim 21, wherein the main layer is present in a central portion of the first region.

24. A method of manufacturing an integrated circuit, the method comprising:
- providing a first continuous layer containing tungsten on a semiconductor portion that includes buried gate and field electrodes extending in a longitudinal direction in a first region, the longitudinal direction given by a longitudinal axis of the gate and field electrodes;
- patterning the first continuous layer to obtain an interface layer with an isolated segment covering the first region;
- providing a second continuous layer containing at least one of copper and aluminum; and
- patterning the second continuous layer to obtain a main layer with a separated segment covering a first portion of the isolated segment of the interface layer and leaving uncovered a second portion of the isolated segment.

* * * * *